United States Patent [19]

Hester et al.

[11] Patent Number: 4,788,683
[45] Date of Patent: Nov. 29, 1988

[54] DATA PROCESSING SYSTEM EMULATION WITH MICROPROCESSOR IN PLACE

[75] Inventors: Phillip D. Hester, Austin, Tex.; William M. Johnson, San Jose, Calif.

[73] Assignee: IBM Corporation, Armonk, N.Y.

[21] Appl. No.: 143,308

[22] Filed: Jan. 7, 1988

Related U.S. Application Data

[63] Continuation of Ser. No. 819,097, Jan. 14, 1986, abandoned.

[51] Int. Cl.⁴ .............................................. G06F 11/30
[52] U.S. Cl. ......................................... 371/20; 371/25
[58] Field of Search ........................ 371/20, 16, 25; 324/73 R, 73 AT; 364/200 MS File

[56] References Cited

U.S. PATENT DOCUMENTS

| | | |
|---|---|---|
| 4,023,142 | 5/1977 | Woessner . |
| 4,312,066 | 1/1982 | Bantz ................................. 371/16 |
| 4,366,540 | 12/1982 | Berglund ........................... 364/200 |
| 4,455,654 | 6/1984 | Bhaskar ....................... 324/73 R X |
| 4,500,993 | 2/1985 | Jacobson ..................... 324/73 R X |
| 4,553,090 | 11/1985 | Hatano ........................... 324/73 AT |
| 4,597,080 | 6/1986 | Thatte ............................ 324/73 R X |
| 4,606,024 | 8/1986 | Glass .................................. 371/16 |
| 4,674,089 | 6/1987 | Poret ................................ 371/16 X |

OTHER PUBLICATIONS

P. A. Beaven, "Card Testing A Microprocessor", IBM Tab, vol. 22, No. 4, 9/1978, pp. 1664–1665.

Primary Examiner—Jerry Smith
Assistant Examiner—Robert W. Beausoliel .
Attorney, Agent, or Firm—Walter J. Madden, Jr.; Alan H. MacPherson; John L. Jackson

[57] ABSTRACT

Apparatus is provided for testing a data processing system which includes a microprocessor, the testing occurring with the microprocessor in place in the system. The apparatus comprises: a support microprocessor for controlling the testing, a serial-to-parallel and parallel-to-serial converter connected between the support microprocessor and the system microprocessor, means for supplying a series of level sensitive scan design (LSSD) test signals from the support microprocessor through the converter to the system microprocessor, and means for returning the results of the level sensitive scan design test signals from the system microprocessor through the converter to the support microprocessor.

8 Claims, 4 Drawing Sheets

DATA PROCESSING SYSTEM EMULATION WITH MICROPROCESSOR IN PLACE

This application is a continuation of application Ser. No. 819,097, filed Jan. 14, 1986, and now abandoned.

BACKGROUND OF THE INVENTION

Field of the Invention

This invention relates to testing of microprocessors and relates more particularly to an alternative to in-circuit emulation that is supported by a microprocessor being emulated.

PRIOR ART

In-circuit emulation (ICE) is a concept used by many microprocessor manufacturers to allow low-level hardware testing or debug by replacing the system microprocessor with an emulator. This does allow system debug, but it requires that the system microprocessor by physically removed from the system and the emulator be connected in its place. In the in-circuit approach, the system microprocessor is physically removed from the system under test, and replaced with a connection to the ICE hardware, as shown in FIG. 1. The microprocessor in the ICE hardware is then used in place of the system microprocessor, and the support logic in the in-circuit emulator is used to monitor microprocessor activity. Software is also provided in the in-circuit emulator to control operation of the support logic so that functions such as instruction trace, stop-on-address, instruction single step, and cycle step can be implemented.

Although this approach provides the functions typically required for low-level debug, it has several undesirable properties. First, it requires the system microprocessor to be physically removed and replaced by a connection to the ICE hardware. This is undesirable, since the timing and electrical loading characteristics of the ICE connection are potentially different than the actual characteristics when the system microprocessor is in place. Secondly, the ICE hardware is complex and fairly expensive. This hardware is also specific to each type of microprocessor, requiring unique hardware and software to be developed to support each type of microprocessor used in the system under test. Thirdly, since the ICE hardware utilizes the same microprocessor (without any internal changes) as the system microprocessor, external logic is required to determine what is happening within the microprocessor to support such functions as instruction trace and stop-on-address.

This approach has been successfully used by many manufacturers, with most development groups purchasing ICE hardware for their system debug. This has typically provided good results, but it is essentially an "after the fact" approach to system debug. In this approach, the design of the microprocessor occurs independently from the ICE design.

SUMMARY OF THE INVENTION

The present invention is directed to a testing technique which allows the system microprocessor to remain in the system, and which utilizes logic both within the system microprocessor and in a support processor to provide equivalent functions to the in-circuit emulation approach. The invention utilizes level sensitive scan design (LSSD) scan paths and specific internal logic within the tested microprocessor to support the required low-level debug functions. An external support processor is used to control operation of these debug functions and provide the required high-level debug functions. LSSD techniques are described in the following publications. "Computer-Aided Design, Testing and Packaging" Chapter V, IEEE Catalog No. EHO 1917, 1982.

"A Logic Design Structure For LSI Testability", Eichelberger, Proceedings, 14th Design Automation Conference, (IEEE), 1977, pp. 462-468.

U.S. Pat. Nos. 3,761,695 and 3,783,254, Eichelberger.

In general, these are two basic concepts involved in LSSD. They are:
1. Design sequential logic structures which are not dependent on signal rise and fall times or circuit and interconnect delays (level sensitive);
2. Design all internal storage elements so they are controllable and observable (scan design).

DESCRIPTION OF THE PREFERRED EMBODIMENT

Figure 1:
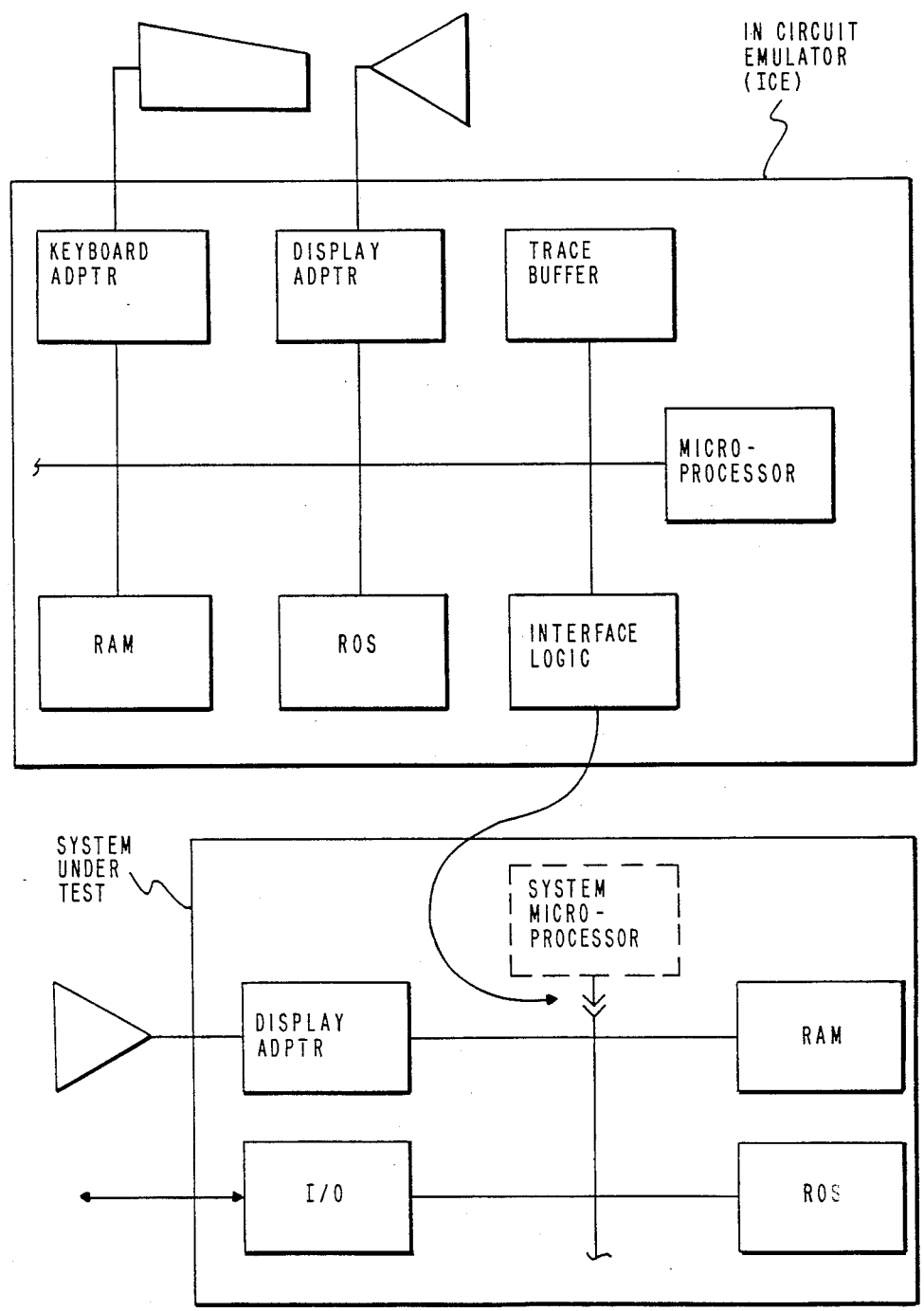
FIG. 1 is a schematic representation of a prior art ICE implementation.
Figure 2:
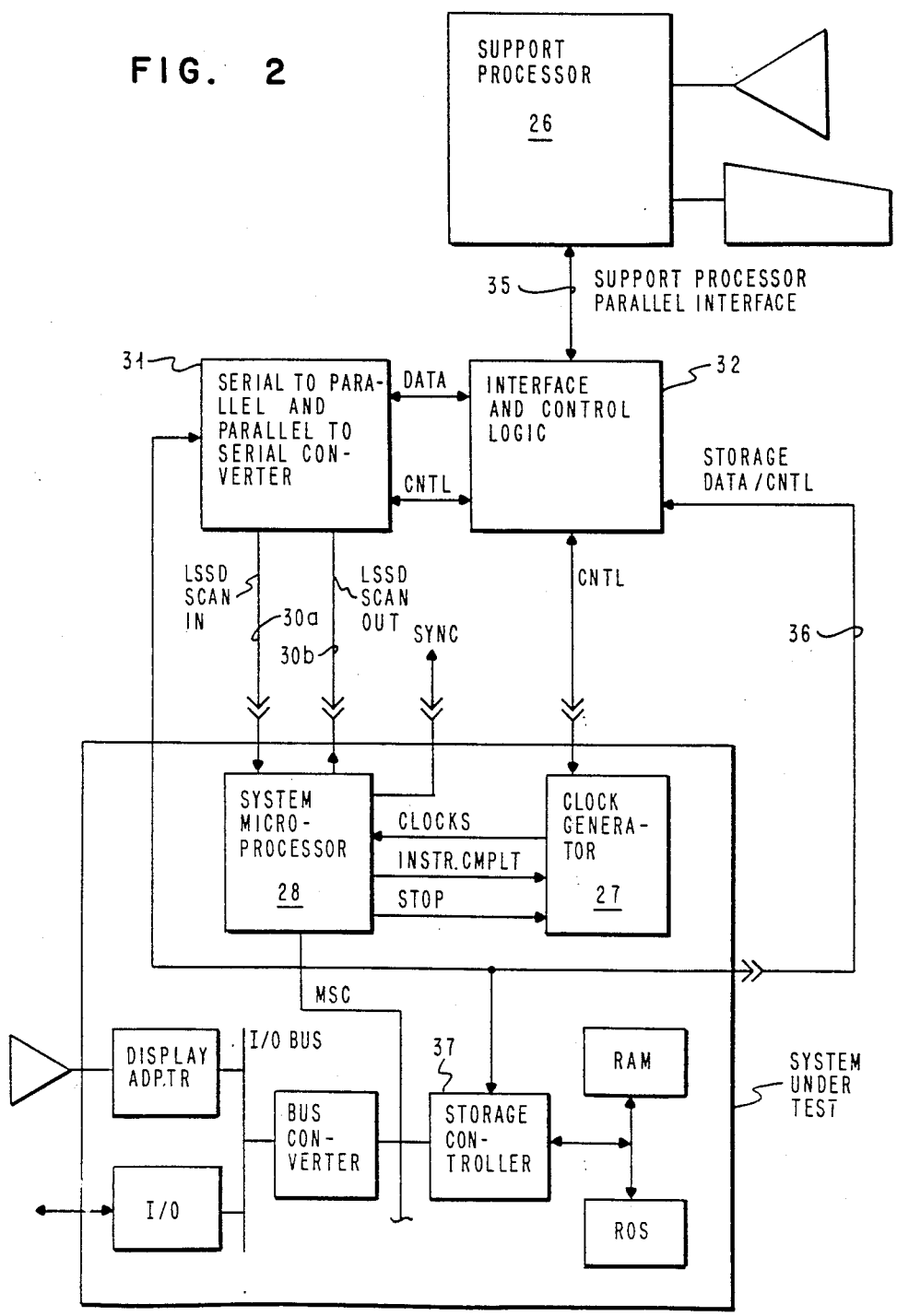
FIG. 2 is a block diagram illustrating the connection of the support processor to a clock generator and a microprocessor to be tested.

As shown in FIG. 2, the support processor 26 attaches to the microprocessor 28 in the system under test through the LSSD scan strings 30a and 30b, and also connects through interface and control logic 32 to a clock generator 27 by means of dedicated control lines. Also shown in FIG. 2 is a serial-to-parallel and parallel-to-serial converter 31 to convert the parallel data format of the support processor 26 to the serial format of the LSSD scan strings. This converter is optional and, alternatively, the functions could be performed by software in the support processor; however, converter 31 typically is used to improve performance of the support processor 26 through a bus 35. The interface and control logic 32 contains logic which connects to the support processor bus 35. Unit 32, along with converter 31, generate the required data and control signals for the LSSD scan strings, the clock generator controls, and the storage interface.

The support processor may be a general purpose computer, such as an IBM PC, IBM Series 1, etc., containing programs which interface to the LSSD scan strings and the clock generator 27 to implement the required debug functions. The support processor program typically determines the location of specific registers in the various LSSD scan strings and formats this data into a meaningful form for display to the user. The functions typically provided by this software include the ability to examine and alter registers in the system microprocessor 28, examine and alter various latch bits in the LSSD scan strings, control the stop-on-address functions, and control the instruction step and cycle step functions. These functions are determined by the software in the support processor and are easily modified without requiring changes to the hardware within microprocessor 28. In a representative but not limiting embodiment, five separate scan strings may be formed to perform a large number of tests on over seven hundred different registers in the system under test.

In addition to the microprocessor interface, a separate interface 36 is provided to the storage controller 37 in the tested system which allows the support processor to load programs into storage, save programs from storage, and examine and alter the contents of storage. Such an interface may be of the type shown and described in copending application Ser. No. 595,159 filed 3/30/84, (AT9-84-013) entitled "Storage Testing Through A Serial Bus Bypass of The Main Parallel Data Bus Between A Central Processor and Main Storage Unit," and assigned to the same assignee as the present application. This copending application is incorporated herein by reference.

Figures 3, 3B:
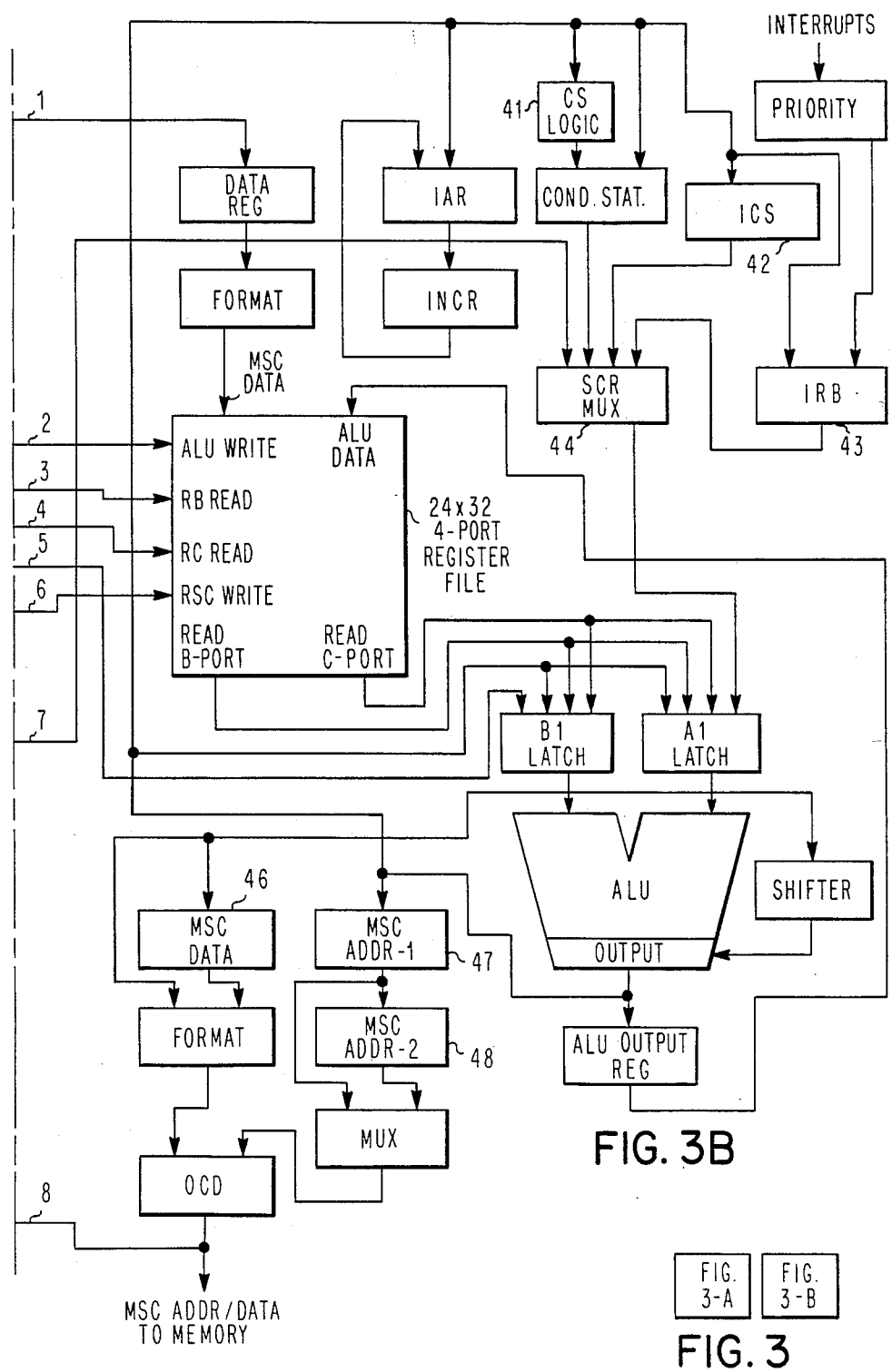
FIGS. 3A and 3B when placed side by side represent a block diagram showing the basic microprocessor data flow of the present invention.
Figure 3A:
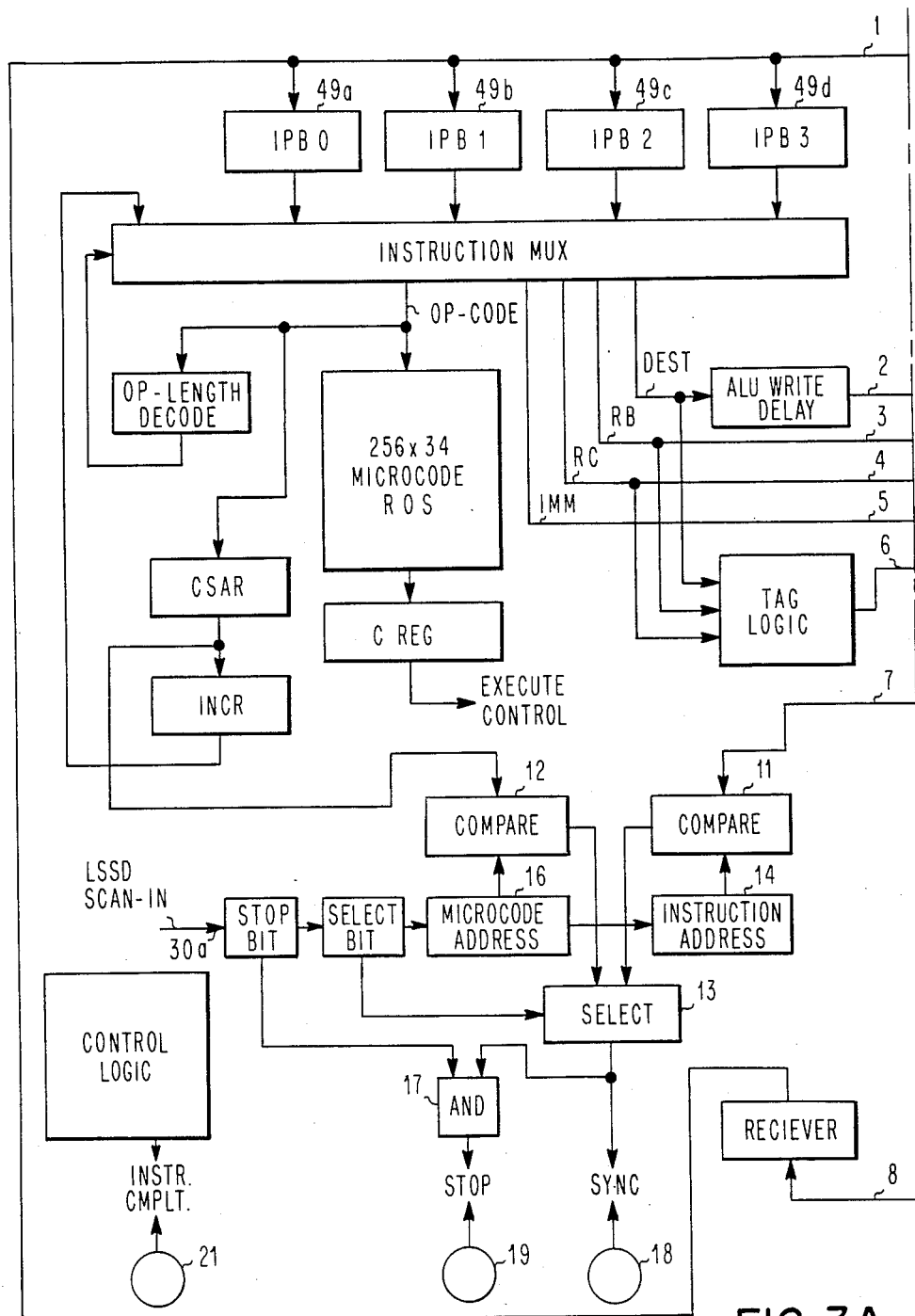

The basic microprocessor data flow and internal debug logic is shown in FIGS. 3A and 3B which may be placed side by side with lines 1–7 aligned. The debug logic includes two comparators (FIG. 3A), one labeled 11 for instruction addresses and the other identified as 12 for instruction op-codes. Selection logic 13 determines which comparator output is selected. An instruction compare address register 14 and an op-code compare address register 16 are accessible by the LSSD scan strings on line 30a, and contain the desired instruction and op-code compare values, respectively. In addition to the selection between stop on instruction address or op-code made by the selection logic 13, stop enable logic 17 contains a single latch bit to enable the stop-on-address function.

One output is provided for the compare output 18 and a separate output is provided for the stop-on-address function 19. The compare output from 18 can be used as a sync pulse to an external logic analyzer. The stop output from 19 is used in conjunction with the external clock generator to disable the clocks when the stop address is detected. A third output 21 is provided which toggles each time an instruction is executed. This "Instruction Complete" output is required to implement an instruction single step function, since instructions may take more than one cycle to execute. Without this output, it would be difficult, if not impossible, for external logic to determine when an instruction was executed. The "Instruction Complete" output can also be connected to an external frequency counter to measure the instruction execution rate, usually expressed in millions of instructions per second (MIPs).

Referring to FIG. 3b, the system also contains a condition status logic element 41, an interrupt control status register 42, an interrupt request buffer 43, a system control register multiplexor 44, a microprocessor storage channel data register 46, two microprocessor storage control address registers 47, 48 and instruction prefetch buffers 49a, 49b, 49c and 49d (FIG. 3A).

A typical screen image from the support processor display may include a display of the general purpose registers, system control registers, the contents of the instruction prefetch buffer, and the ALU input registers AI and BI. Also, the contents of main storage address X'00000000' through X'0000004F' may be displayed.

Using the LSSD interface to the microprocessor, the internal address compare logic in the microprocessor and the storage interface allows the support processor to provide functions equivalent to the traditional ICE approach. However, it is not necessary to remove the microprocessor from the system under test. In this way, the behavior of the system is identical with and without the support processor connected.

The unique features presented by this invention can be summarized as follows:

1. In-circuit emulation without removing the microprocessor. This invention makes use of the LSSD scan paths and internal chip logic to allow an external support processor to control and examine the contents of all facilities within the microprocessor. Specific internal chip logic has been added to eliminate the need for external support logic to provide the required low-level debug functions (i.e., stop on instruction address or instruction op-code, and instruction single step). These features eliminate the need to unplug the system microprocessor.

2. No disturbance to the system under test. This invention allows the microprocessor to remain in the system under test, and does not require any additional loading on system buses. This guarantees that system timing is not affected. This also allows the system to run at normal speed, and eliminates possible speed limitations imposed by the ICE approach.

3. Elimination of external support logic for stop-on-address and instruction step functions. Logic is provided in the microprocessor to support these functions, thereby eliminating the need for external support logic as is required with the ICE approach.

4. In-circuit emulation functions using a general purpose support processor. In the traditional ICE approach, a microprocessor of the type being emulated is required in the ICE hardware. The approach described herein allows any general purpose processor to be used, with software only providing the required functions. This has the advantage of allowing a single support processor to support a number of microprocessor types with only software changes.

We claim:

1. Apparatus for testing a data processing system including a microprocessor, said testing occurring with said microprocessor in place in said system, said apparatus comprising:
  a support microprocessor for controlling said testing;
  a serial-to-parallel and parallel-to-serial converter connected between said support microprocessor and said system microprocessor;
  means for supplying a series of parallel level sensitive scan design test signals from said support microprocessor through the parallel-to-serial portion of said converter to supply a series of serial test signals to said system microprocessor;
  said system microprocessor having both low level and high level functions to be tested;
  additional internal logic within said system microprocessor to support said low level testing functions of said system microprocessor in response to said level sensitive scan design test signals;
  said support microprocessor providing signals for testing both said low level testing functions and said high level testing functions for testing said system microprocessor; and
  means for returning the serial results of said low and said high level sensitive scan design test signals from said system microprocessor through the serial-to-parallel portion of said converter to supply a series of parallel test signal results to said support microprocessor.

2. Apparatus in accordance with claim 1 including interface and control logic means connected between said support processor and said converter means.

3. Apparatus in accordance with claim 2 including;

storage means;

storage controller means connected to said storage means; and means connecting said support processor to said storage control means to permit said support processor to test said storage controller means and said storage means.

4. Apparatus in accordance with claim 3 in which said interface and control logic means comprises said means for connecting said support processor to said storage controller means.

5. Apparatus in accordance with claim 3 in which said storage means includes random access memory means and read only storage means.

6. Apparatus in accordance with claim 2 including:

a clock generator; and means connecting said clock generator to said system microprocessor and to said interface and said control logic means.

7. Apparatus in accordance with claim 1 in which said additional internal logic within said system microprocessor to support the low level testing functions of said system microprocessor includes a first comparator for comparing instruction addresses and a second comparator for comparing instruction operation codes.

8. Apparatus in accordance with claim 7 including selection logic for selecting either said first comparator or said second comparator.

* * * * *